(12) United States Patent
Kumazawa et al.

(10) Patent No.: US 6,506,540 B2
(45) Date of Patent: Jan. 14, 2003

(54) PHOTOPOLYMERIZABLE COMPOSITION

(75) Inventors: Akira Kumazawa, Kanagawa (JP); Shinichiro Ishino, Kanagawa (JP); Hiroyuki Obiya, Kanagawa (JP); Kenji Tazawa, Kanagawa (JP)

(73) Assignee: Tokyo Ohka Kogyo Co., Ltd. (JP)

( * ) Notice: Subject to any disclaimer, the term of this patent is extended or adjusted under 35 U.S.C. 154(b) by 0 days.

(21) Appl. No.: 09/855,785

(22) Filed: May 15, 2001

(65) Prior Publication Data

US 2002/0031723 A1 Mar. 14, 2002

(30) Foreign Application Priority Data

Jun. 21, 2000 (JP) ........................................ 2000-186308

(51) Int. Cl.$^7$ .............................................. G03F 7/004
(52) U.S. Cl. ..................... 430/281.1; 430/905; 522/149
(58) Field of Search ............................ 430/281.1, 905; 522/149

(56) References Cited

U.S. PATENT DOCUMENTS 4,960,673 A * 10/1990 Beck et al. ................. 430/271

FOREIGN PATENT DOCUMENTS

| JP | 11176330 | * | 7/1999 |
| JP | 2000-147759 | | 5/2000 |

OTHER PUBLICATIONS machine translation of JP 11176330.*
CAPLUS abstract of JP 11176330.*
Translation of JP 11–176330, Jul. 1999.*

* cited by examiner

*Primary Examiner*—Rosemary Ashton
(74) *Attorney, Agent, or Firm*—Fish & Richardson P.C.

(57) ABSTRACT

A photopolymerizable composition comprising (A) a polymer binder, (B) a photopolymerizable monomer and (C) a photopolymerization initiator, wherein the component (B) is at least one compound represented by the following formula (1):

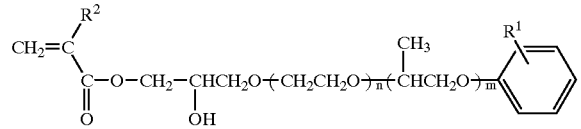

3 Claims, No Drawings

PHOTOPOLYMERIZABLE COMPOSITION

FIELD OF THE INVENTION

The present invention relates to a photopolymerizable composition and, more particularly, to a photopolymerizable composition which has an excellent adhesion to a substrate, shows good burn-out properties, and forms a pattern with good profiles.

BACKGROUND OF THE INVENTION

Photopolymerizable compositions have so far been used in various fields such as resists for making a printing plate, resists for fine working, varnishes for a photo-sensitive coating, and adhesives for glass. Such photopolymeriable compositions are compounds which generally contain a polymer binder, a photopolymerizable monomer and a photopolymerization initiator. In particular, photopolymerization compositions containing, as the photopolymerizable monomer, acrylic compounds such as 2-hydroxyethyl acrylate, 2-hydroxyethyl methacrylate, pentaerythritol triacrylate and pentaerythritol trimethacrylate are preferably used as resists for use in fine working such as manufacturing of electronic parts.

Fine working using the photopolymerizable composition containing the above-described acrylic photopolymerizable monomer is commonly a so-called lithography treatment in which a pattern is formed on a substrate from the photopolymerizable composition, and the substrate is worked using the pattern as a mask. In recent years, this fine working technology has made further progress, and thus much finer working technology has been demanded. With such an increasing demand, the photopolymerizable compositions have been required to have good adhesion to a substrate and good burn-out properties upon baking for removing remaining patterns which become useless after patterning of the substrate, as well as good sensitivity and good resolution. Although conventional photopolymerizable compositions containing a polymer binder, a photopolymerizable monomer and a photopolymerization initiator show excellent sensitivity and resolution, they have insufficient adhesion to a substrate and insufficient burn-out properties, thus photopolymerizable compositions being excellent in these properties as well having eagerly been demanded.

SUMMARY OF THE INVENTION

As a photopolymerizable composition which meets the demand, the inventors have formerly proposed a polymerizable composition containing a polymer binder, at least one photopolymerizable monomer selected from the group consisting of a specific salicylic acid ester and a phthalic acid diester, and a photopolymerization initiator. As a result of further investigations to obtain a photopolymerizable composition having better adhesion to a substrate, the inventors have found that a photopolymerizable composition having much better adhesion to a substrate and excellent burn-out properties can be obtained by using a specific compound as the photopolymerizable monomer, thus having completed the present invention based on the finding.

The present invention provides a photopolymerizable composition showing excellent sensitivity and resolution, and having excellent adhesion to a substrate and burn-out properties as well.

The present invention is a photopolymerizable composition comprisining (A) a polymer binder, (B) a photopolymerizable monomer and (C) a photopolymerization initiator, wherein the component (B) is at least one member selected from compounds represented by the following

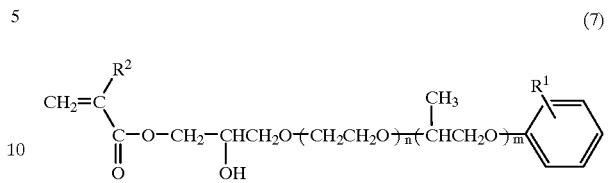

(7)

wherein $R^1$ represents a hydrogen atom, a hydroxyl group, an alkyl group having 1 to 9 carbon atoms and optionally having a hydroxyl group, or a substituent represented by the following formula (8):

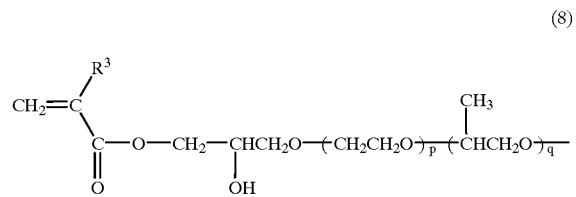

(8)

wherein $R^3$ represents a hydrogen atom or a methyl group, and p and q each represent an integer with the sum thereof being 14 or less, $R^2$ represents a hydrogen atom or a methyl group and m and n each represent an integer with the sum thereof being 14 or less.

DETAILED DESCRIPTION OF THE INVENTION

The invention is described in more detail below.

The photopolymerizable composition of the invention is a photopolymerizable composition containing the component (A), component (B) and component (C) as described above and, as the component (A), there are specifically illustrated polymerization or copolymerization products of acrylic acid, methacrylic acid, methyl acrylate, methyl methacrylate, ethyl acrylate, ethyl methacrylate, n-butyl acrylate, n-butyl methacrylate, isobutyl acrylate, isobutyl methacrylate, monomethyl fumarate, monoethyl fumarate, monopropyl fumarate, monomethyl maleate, monoethyl maleate, monopropyl maleate, sorbic acid, hydroxymethyl acrylate, 2-hydroxyethyl acrylate, 2-hydroxymethyl methacrylate, 2-hydroxypropyl methacrylate, hydroquinone monoacrylate, hydroquinone monomethacrylate, hydroquinone diacrylate, hydroquinone di-2-hydroxyethyl acrylate, 2-hydroxyethyl methacrylate, 2-hydroxypropyl methacrylate, 2-ethylhexyl acrylate, 2-ethylhexyl methacrylate, benzyl acrylate, benzyl methacrylate, phenoxy acrylate, phenoxy methacrylate, isobornyl acrylate, isobornyl methacrylate, ethylene glycol dimethacrylate, triethylene glycol diacrylate, triethylene glycol dimethacrylate, tetraethylene glycol diacrylate, tetraethylene glycol dimethacrylate, butylene glycol dimethacrylate, propylene glycol diacrylate, propylene glycol dimethacrylate, trimethyloletnane triacrylate, trimethylolethane trimethacrylate, trimethylolpropane triacrylate, trimethylolpropane trimethacrylate, tetramethylolpropane tetraacrylate, tetramethylolpropane tetramethacrylate, 1,6-hexanediol diacrylate, 1,6-hexanediol dimethacrylate, cardoepoxy diacrylate, glycidyl methacrylate, glycidyl methacrylate, ethylene glycol diacrylate, fumaric esters of these illustrative compounds wherein (meth)acrylate is replaced by fumarate, maleic esters of these illustrative compounds wherein (meth)acrylate is replaced by maleate; crotonic acid esters of these illustrative compounds wherein (meth)acrylate is replaced by crotonate, itaconic acid esters of these illustrative compounds wherein (meth)acrylate is replaced by itaconate, styrene, acrylamide, methacrylamide, acrylonitrile, methacrylonitrile, etc.; and cellulose derivatives such as hydroxypropyl cellulose, ethylhydroxyethyl cellulose, hydroxypropylmethyl cellulose phthalate, hydroxypropylmethyl cellulose acetate, etc. The component (A) may be used alone or in combination of two or more of them. Among them, hydroxypropyl cellulose is preferably used in the invention.

Content of the component (A) may be 10 to 80 parts by weight per 100 parts by weight of the sum of the component (A), component (B) and component (C).

The component (B) is at least one member selected from compounds represented by the following formula (9):

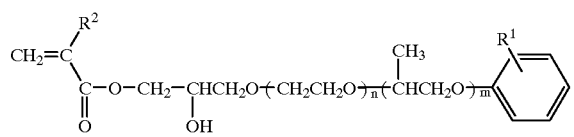

(9)

wherein R¹ represents a hydrogen atom, a hydroxyl group, an alkyl group having 1 to 9 carbon atoms and optionally having a hydroxyl group, or a substituent represented by the following formula (10):

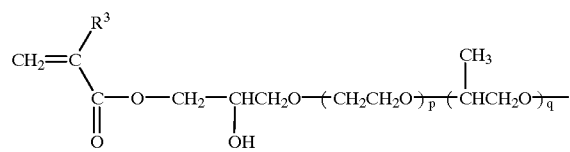

(10)

wherein R³ represents a hydrogen atom or a methyl group, and p and q each represent an integer with the sum thereof being 14 or less, R² represents a hydrogen atom or a methyl group and m and n each represent an integer with the sum thereof being 14 or less.

Incorporation of the component (B) in the photopolymerizable composition serves to improve adhesion between a pattern formed from the photopolymerizable composition and a substrate and provide excellent burn-out properties and good fine workability Use of the compound of the formula (9) wherein both m and n represent 0 much more improves the adhesion Specific examples of the compound represented by the formula (9) are compounds represented by the formula (11) through formula (18), with compounds of formula (11), formula (12), formula (15) and formula (16) being more preferred.

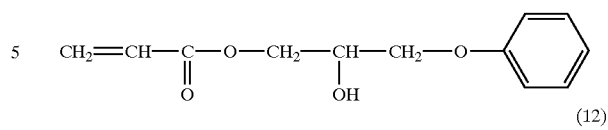

(11)

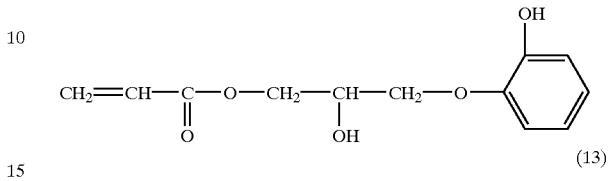

(12)

(13)

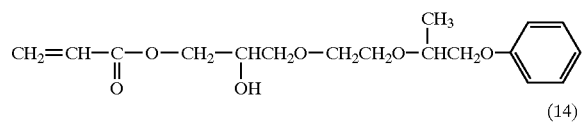

(14)

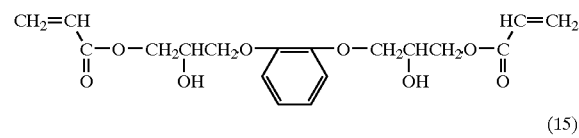

(15)

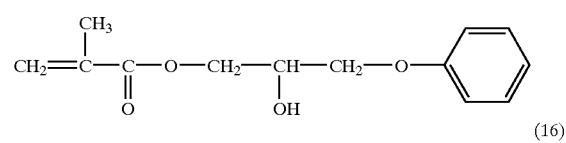

(16)

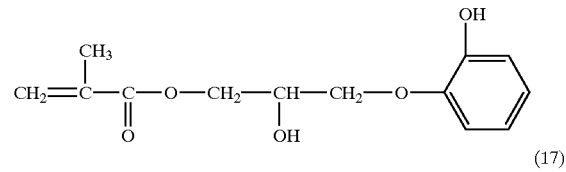

(17)

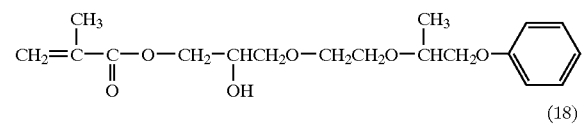

(18)

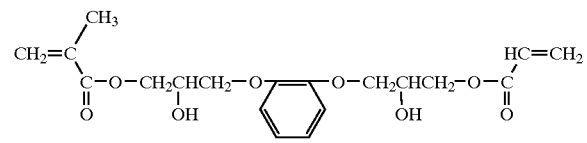

Content of the component (B) may be 10 to 80 parts by weight per 100 parts by weight of the sum of the component (A), component (B) and component (C). If the content of the component (B) is less than the above-described range, the resultant photopolymerizable composition is not improved whereas, if more than the range, there results deteriorated burn-out properties, thus such content not being preferred.

The photopolymerizable composition of the invention may further contain known photopolymerizable monomer within an amount not spoiling the advantages of the invention in addition to the component (B) for the purpose of improving coating properties. As such photopolymerizable monomers, there may be illustrated, for example, ethylene glycol diacrylate, ethylene glycol dimethacrylate, triethylene glycol diacrylate, triethylene glycol dimethacrylate, trimethylolpropane triacrylate, trimethylolpropane trimethacrylate, trimethylolethane triacrylate, trimethylolethane trimethacrylate, pentaerythritol diacrylate, pentaerythritol dimethacrylate, pentaerythritol triacrylate, pentaerythritol trimethacrylate, pentaerythritol tetraacrylate, pentaerythritol tetramethacrylate, dipentaerythritol tetraacrylate, dipentaerythritol tetramethacrylate, dipentaerythritol pentaacrylate, dipentaerythritol pentamethacrylate, dipentaerythritol hexaacrylate, dipentaerythritol hexamethacrylate, glycerol acrylate, glycerol methacrylate, cardoepoxy diacrylate, fumaric esters of these illustrative compounds wherein (meth)acrylate is replaced by fumarate, itaconic acid esters of these illustrative compounds wherein (meth)acrylate is replaced by itaconate, and maleic acid esters of these illustrative compounds wherein (meth)acrylate is replaced by maleate.

Content of these photopolymerizable monomer may be 0 to 60 parts by weight per 100 parts by weight of the sum of the component (A), component (B) and component (C).

Further, as the component (C), there may be illustrated 2,4-bis-trichloromethyl-6-(3-bromo-4-methoxy)phenyl-s-triazine, 2,4-bis-trichloromethyl-6-(2-bromo-4-methoxy)-phenyl-s-triazine, 2,4-bis-trichloromethyl-6-(3-bromo-4-methoxy)styrylphenyl-s-triazine, 2,4-bis-trichloromethyl-6-(2-bromo-4-methoxy)styrylphenyl-s-triazine, bis(cyclopentadienyl)-bis[2,6-di-fluoro-3-(pyrr-1-yl)phenyl]titanium, bis(cyclopentadienyl)bis[2,6-difluoro-2-(pyrr-1-yl)phenyl]titanium, bis(cyclopentadienyl)-bis(2,3,4,5,6-pentafluorophenyl)titanium, bis-(cyclopentadienyl)-bis[2,5-difluoro-3-(pyrr-1-yl)phenyl]-titanium, 1-hydroxycyclohexyl phenyl ketone, 2,2-dimethoxy-1,2-diphenylethan-1-one, 2-methyl-1-[4-(methylthio)phenyl]-2-morpholinopropan-1-one, 2-benzyl-2-dimethylamino-1-(4-morpholinophenyl)-butan-1-one, 2-hydroxy-2-methyl-1-phenylpropan-1-one, 2,4,6-trimethylbenzoyldiphenylphosphine oxide, 1-[4-(2-hydroxyethoxy)phenyl]-2-hydroxy-2-methyl-1-propan-1-one, 2,4-diethylthioxanthone, 2,4-dimethylthioxanthone, 2-chlorothioxanthone, 1-chloro-4-propoxythioxanthone, 3,3-dimethyl-4-methoxybenzophenone, benzophenone, 1-(4-isopropylphenyl)-2-hydroxy-2-methylpropan-1-one, 1-(4-dodecylphenyl)-2-hydroxy-2-methylpropan-1-one, 4-benzoyl-4'-methyldimethylsulfide, 4-dimethylaminobenzoic acid, methyl 4-dimethylaminobenzoate, ethyl 4-dimethylaminobenzoate, n-butyl 4-dimethylaminobenzoate, 2-ethylhexyl-4-dimethylaminobenzoate, 2-isoamyl-4-dimethyl aminobenzoate, 2,2-diethoxyacetophenone, benzyl dimethyl ketal, benzyl β-methoxyethyl acetal, 1-phenyl-1,2-propanedi-one-2-(o-ethoxycarbonyl)oxime, methyl o-benzoylbenzoate, bis(4-dimethylaminophenyl)ketone, 4,4'-bisdiethylamino-benzophenone, benzyl, benzoin, benzoin methyl ether, benzoin ethyl ether, benzoin isopropyl ether, benzoin n-butyl ether, benzoin isobutyl ether, p-dimethylaminoacetophenone, p-tert-butyl-trichloroacetophenone, p-tert-butyl-dichloro-acetophenone, thioxanthone, 2-methylthioxanthone, 2-isopropylthioxanthone, dibenzosuberone, α,α-dichloro-4-phenoxyacetophenone, pentyl 4-dimethylaminobenzoate, 2-(o-chlorophenyl)-4,5-diphenylimidazolyl dimer, etc. These compounds to be used as the component (C) may be used independently or in combination of two or more of them.

Content of the component (C) may be 0.1 to 50 parts by weight per 100 parts by weight of the sum of the component (A), component (B) and component (C).

In using the photopolymerizable composition of the invention, the component (A), component (B) and component (C) are dispersed in water or dissolved in an organic solvent. As the organic solvent, there are specifically illustrated ethylene glycol monomethyl ether, ethylene glycol monoethyl ether, propylene glycol monomethyl ether, propylene glycol monoethyl ether, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate and 2-methoxypentyl acetate. These organic solvents may be used alone or in combination of two or more of them.

The photopolymerizable composition of the invention is coated on a substrate in a liquid state or is applied to a substrate by screen printing or the like depending upon use and, in cases where fine working is required as in manufacturing electronic parts, it is preferred to use a photo-sensitive film formed by coating the photopolymerizable composition on a flexible film and drying it. The photo-sensitive film may be prepared by, for example, coating the photopolymerizable composition dissolved in a solvent or dispersed in water on a 15 to 125 μm thick, flexible film of synthetic resin such as polyethylene terephthalate, polyethylene, polypropylene, polycarbonate or polyvinyl chloride using an applicater, a bar coater, a wire bar coater, a roll coater or a curtain flow coater in a dry thickness of 10 to 100 μm, and drying it. In addition, a delaminatable film may be adhesively applied, if necessary, to the photo-sensitive layer in order to stably protect the photo-sensitive layer before its use. As the delaminatable film, polyethylene terephthalate film, polypropylene film or polyethylene film having coated or baked thereon silicone and having a thickness of about 15 to 125 μm is preferred.

Method of using the photopolymerizable composition of the invention is now described below. The photopolymerizable composition of the invention is dissolved in an organic solvent, and the resultant coating solution is coated on a glass substrate, followed by drying to form a photopolymerizable layer on the substrate. This layer is imagewise exposed, through a mask, to actinic rays such as UV rays, excimer laser, X-rays or electron beams, then subjected to development processing using a general-purpose alkali developing solution or water to thereby dissolve away unexposed portions and form a pattern on the glass substrate. As the alkali ingredient in the alkali developing solution to be used in the development processing, there may be illustrated hydroxides, carbonates, bicarbonates, phosphates or pyrophosphates of alkali metals such as lithium, sodium and potassium, primary amines such as benzylamine and butylamine, secondary amines such as dimethylamine, dibenzylamine and diethanolamine, tertiary amines such as trimethylamine, triethylamine and triethanolamine, cyclic amines such as morpholine, piperazine and pyridine, polyamines such as ethylenediamine and hexamethylenediamine, ammonium hydroxides such as tetramethylammonium hydroxide, tetraethylammonium hydroxide, trimethylbenzylammonium hydroxide and trimethylphenylbenzyl-ammonium hydroxide, trimethylsulfonium hydroxides, sulfonium hydroxides such as trimethylsulfonium hydroxide and dimethylbenzyllsulfonium hydroxide, choline, and silicate-containing buffer solution.

EXAMPLE

The invention is described in more detail by reference to Examples which, however, do not limit the invention in any way.

Example 1

| | |
|---|---|
| 1. Hydroxypropyl cellulose | 10 parts by weight |
| 2. Compound represented by the following formula (19): | 10 parts by weight |

$$CH_2=\overset{CH_3}{\underset{}{C}}-\underset{\underset{O}{\|}}{C}-O-CH_2-\underset{OH}{\underset{|}{CH}}-CH_2-O-\phi \quad (19)$$

| | |
|---|---|
| 3. Irgacure 907 (made by Ciba Speciality Chemicals Co., Ltd.) | 0.5 part by weight |
| 4. Diethylthioxanthone | 0.5 part by weight |
| 5. Blue fluorescent substance for PDP ($BaMgAl_{10}O_{17}$:Eu) | 49 parts by weight |
| 6. 3-methyl-3-methoxybutanol | 40 parts by weight |

The above-described components 1 to 6 were well stirred to prepare a solution of a photopolymerizable composition.

Then, the thus prepared solution of the photopolymerizable composition was coated on a soda-lime glass substrate in a dry thickness of 30 μm, then subjected to UV ray exposure through a test pattern in an exposure amount of 100 mJ/cm$^2$ using an ultra-high pressure mercury lamp. Subsequently, spray development was conducted using 30° C. water at a jet pressure of 3 kg/cm$^2$ for 30 seconds to form a pattern. Evaluation of the thus obtained pattern with respect to adhesion revealed that residual minimum line width was 50 μm.

In addition, in order to evaluate burn-out properties of the pattern, it was subjected to baking treatment of heating at a temperature-raising rate of 10° C./min and maintaining at 520° C. for 30 minutes. As a result, it was confirmed that no pattern remained on the substrate, i.e., the pattern was completely removed from the substrate surface.

Example 2

A solution of a photopolymerizable composition was prepared in the same manner as in Example 1 except for using the compound represented by the following formula (20):

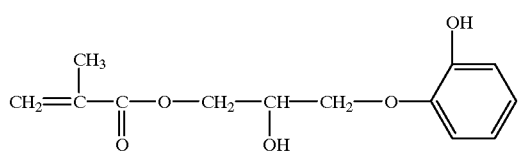

(20)

in place of the compound of formula (19).

Then, the thus prepared solution of the photopolymerizable composition was coated on a soda-lime glass substrate in a dry thickness of 30 μm, then subjected to UV ray exposure through a test pattern in an exposure amount of 100 mJ/cm$^2$ using a super-high pressure mercury lamp. Subsequently, spray development was conducted using 30° C. water at a jet pressure of 3 kg/cm$^2$ for 30 seconds to form a pattern. Evaluation of the thus obtained pattern with respect to adhesion revealed that residual minimum line width was 50 μm.

In addition, in order to evaluate burn-out properties of the pattern, it was subjected to the same baking treatment as in Example 1. As a result, it was confirmed that no pattern remained on the substrate, i.e., the pattern was completely removed from the substrate surface.

Example 3

A solution of a photopolymerizable composition was prepared in the same manner as in Example 1 except for using the compound represented by the following formula (21):

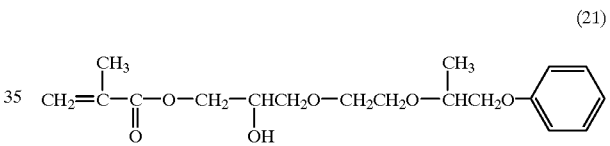

(21)

in place of the compound of formula (19).

Then, the thus prepared solution of the photopolymerizable composition was coated on a soda-lime glass substrate in a dry thickness of 30 μm, then subjected to UV ray exposure through a test pattern in an exposure amount of 200 mJ/cm$^2$ using a super-high pressure mercury lamp. Subsequently, spray development was conducted using 30° C. water at a jet pressure of 3 kg/cm$^2$ for 30 seconds to form a pattern. Evaluation of the thus obtained pattern with respect to adhesion revealed that residual minimum line width was 80 μm.

In addition, in order to evaluate burn-out properties of the pattern, it was subjected to the same baking treatment as in Example 1. As a result, it was confirmed that no pattern remained on the substrate, i.e., the pattern was completely removed from the substrate surface.

Example 4

A solution of a photopolymerizable composition was prepared in the same manner as in Example 1 except for using the compound represented by the following formula (22):

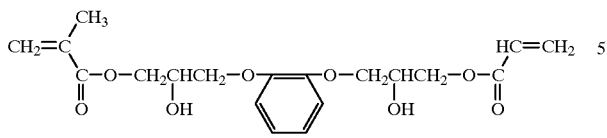

(22)

in place of the compound of formula (19).

Then, the thus prepared solution of the photopolymerizable composition was coated on a soda-lime glass substrate in a dry thickness of 30 µm, then subjected to UV ray exposure through a test pattern in an exposure amount of 100 mJ/cm$^2$ using a super-high pressure mercury lamp. Subsequently, spray development was conducted using 30° C. water at a jet pressure of 3 kg/cm$^2$ for 30 seconds to form a pattern. Evaluation of the thus obtained pattern with respect to adhesion revealed that residual minimum line width was 60 µm.

In addition, in order to evaluate burn-out properties of the pattern, it was subjected to the same baking treatment as in Example 1. As a result, it was confirmed that no pattern remained on the substrate, i.e., the pattern was completely removed from the substrate surface.

Example 5

| 1. Hydroxypropyl cellulose | 10 parts by weight |
| 2. Compound represented by the following formula (23): | 10 parts by weight |

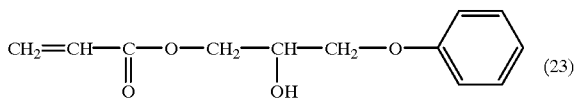

(23)

| 3. Irgacure 907 (made by Ciba Speciality Chemicals Co., Ltd.) | 0.5 part by weight |
| 4. Diethylthioxanthone | 0.5 part by weight |
| 5. Blue fluorescent substance for PDP (BaMgAl$_{10}$O$_{17}$:Eu) | 49 parts by weight |
| 6. 3-methyl-3-methoxybutanol | 40 parts by weight |

The above-described components 1 to 6 were well stirred to prepare a solution of a photopolymerizable composition.

Then, the thus prepared solution of the photopolymerizable composition was coated on a soda-lime glass substrate in a dry thickness of 30 µm, then subjected to UV ray exposure through a test pattern in an exposure amount of 50 mJ/cm$^2$ using an ultra-high pressure mercury lamp. Subsequently, spray development was conducted using 30° C. water at a jet pressure of 3 kg/cm$^2$ for 30 seconds to form a pattern. Evaluation of the thus obtained pattern with respect to adhesion revealed that residual minimum line width was 50 µm.

In addition, in order to evaluate burn-out properties of the pattern, it was subjected to baking treatment of heating at a temperature-raising rate of 10° C./min and maintaining at 520° C. for 30 minutes. As a result, it was confirmed that no pattern remained on the substrate, i.e., the pattern was completely removed from the substrate surface.

Example 6

A solution of a photopolymerizable composition was prepared in the same manner as in Example 5 except for using the compound represented by the following formula (24):

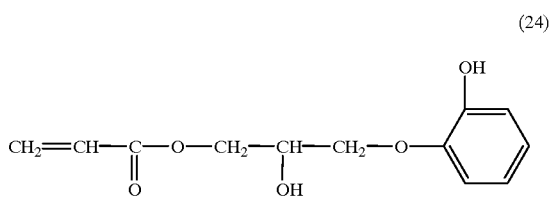

(24)

in place of the compound of formula (23).

Then, the thus prepared solution of the photopolymerizable composition was coated on a soda-lime glass substrate in a dry thickness of 30 µm, then subjected to UV ray exposure through a test pattern in an exposure amount of 100 mJ/cm$^2$ using a super-high pressure mercury lamp. Subsequently, spray development was conducted using 30° C. water at a jet pressure of 3 kg/cm$^2$ for 30 seconds to form a pattern. Evaluation of the thus obtained pattern with respect to adhesion revealed that residual minimum line width was 50 µm.

In addition, in order to evaluate burn-out properties of the pattern, it was subjected to the same baking treatment as in Example 5. As a result, it was confirmed that no pattern remained on the substrate, i.e., the pattern was completely removed from the substrate surface.

Example 7

A solution of a photopolymerizable composition was prepared in the same manner as in Example 5 except for using the compound represented by the following formula (25):

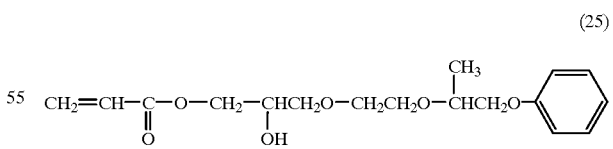

(25)

in place of the compound of formula (23).

Then, the thus prepared solution of the photopolymerizable composition was coated on a soda-lime glass substrate in a dry thickness of 30 µm, then subjected to UV ray exposure through a test pattern in an exposure amount of 100 mJ/cm$^2$ using a super-high pressure mercury lamp. Subsequently, spray development was conducted using 30° C. water at a jet pressure of 3 kg/cm$^2$ for 30 seconds to form a pattern. Evaluation of the thus obtained pattern with respect to adhesion revealed that residual minimum line width was 80 μm.

In addition, in order to evaluate burn-out properties of the pattern, it was subjected to the same baking treatment as in Example 5. As a result, it was confirmed that no pattern remained on the substrate, i.e., the pattern was completely removed from the substrate surface.

Example 8

A solution of a photopolymerizable composition was prepared in the same manner as in Example 5 except for using the compound represented by the following formula (26):

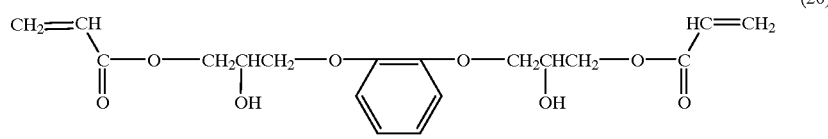

in place of the compound of formula (23).

Then, the thus prepared solution of the photopolymerizable composition was coated on a soda-lime glass substrate in a dry thickness of 30 μm, then subjected to UV ray exposure through a test pattern in an exposure amount of So mJ/cm$^2$ using a super-high pressure mercury lamp. Subsequently, spray development was conducted using 30° C. water at a jet pressure of 3 kg/cm$^2$ for 30 seconds to form a pattern. Evaluation of the thus obtained pattern with respect to adhesion revealed that residual minimum line width was 60 μm.

In addition, in order to evaluate burn-out properties of the pattern, it was subjected to the same baking treatment as in Example 5. As a result, it was confirmed that no pattern remained on the substrate, i.e., the pattern was completely removed from the substrate surface.

Comparative Example 1

A solution of a photopolymerizable composition was prepared in the same manner as in Example 1 except for using pentaerythritol triacrylate in place of the photopolymerizable monomer used in Example 1. Adhesion and burn-out properties of a pattern formed from the solution were evaluated in the same manner as in Example 1 using the solution of the photopolymerizable composition. As a result, it was confirmed that residual minimum line width was 200 μm, and that baking residue remained on the substrate, thus adhesion and burn-out properties being poor.

The photopolymerizable composition of the invention is excellent in adhesion to a substrate and burn-out properties as well as sensitivity and resolution, and can form a pattern with good profiles, thus being favorably usable in the field where fine working is required, such as manufacturing of electronic parts.

Although the invention has been described with respect to specific embodiments, the details are not to be construed as limitations, for it will become apparent that various embodiments, changes and modifications may be resorted to without departing from the spirit and scope thereof, and it is understood that such equivalent embodiments are intended to be included within the scope of this invention.

What is claimed is:

1. A photopolymerizable composition dipersed in the water or dissolved in an organic solvent consisting essentially of the components of: (A) a hydroxypropyl cellulose; (B) a photopolymerizable monomer; and (C) a photopolymerization initiator, wherein the component (B) is at least one compound represented by the following formula (1):

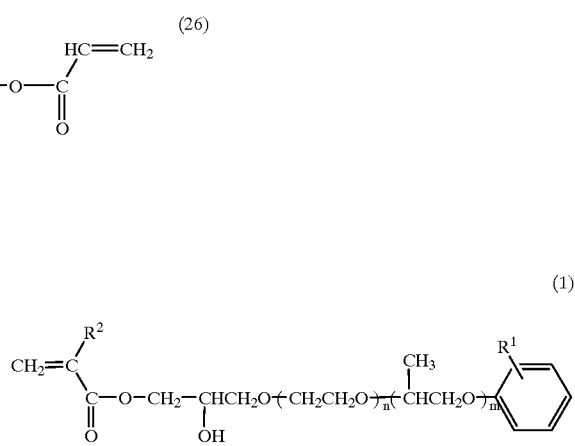

wherein $R^1$ represents a hydrogen atom, a hydroxyl group, an alkyl group having 1 to 9 carbon atoms that optionally has a hydroxyl group, $R^2$ represents a hydrogen atom or a methyl group; and m and n each represent an integer with the sum thereof being 14 or less; and wherein the content of the component (B) is 10 to 80 parts by weight per 100 parts by weight of the sum of the component (A), the component (B) and the component (C).

2. The photopolymerizable composition according to claim 1, wherein m and n each represent 0.

3. The photopolymerizable composition according to claim 2, wherein the component (B) is at least one compound selected from the group consisting of the following formula (3) to (6):

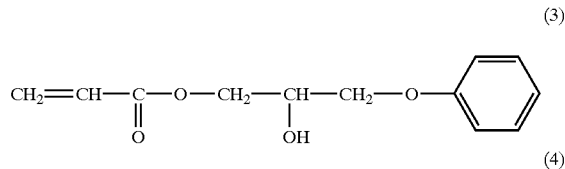

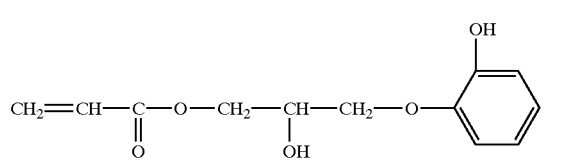

-continued
(5)
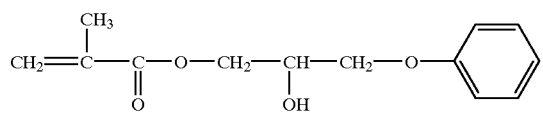
-continued
(6)
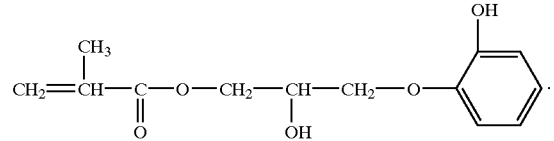
* * * * *